(12) United States Patent
Hong et al.

(10) Patent No.: US 7,045,368 B2
(45) Date of Patent: May 16, 2006

(54) MRAM CELL STRUCTURE AND METHOD OF FABRICATION

(75) Inventors: Liubo Hong, San Jose, CA (US); Tom Zhong, Sunnyvale, CA (US); Lin Yang, Fremont, CA (US)

(73) Assignees: Headway Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 0 days.

(21) Appl. No.: 10/849,311

(22) Filed: May 19, 2004

(65) Prior Publication Data

US 2005/0260773 A1    Nov. 24, 2005

(51) Int. Cl.
*H01L 21/00* (2006.01)

(52) U.S. Cl. .......................... 438/3; 438/240

(58) Field of Classification Search .................... 438/3, 438/240
See application file for complete search history.

(56) References Cited

U.S. PATENT DOCUMENTS

| | | | | |
|---|---|---|---|---|
| 5,747,382 A * | 5/1998 | Huang et al. | ............... | 438/624 |
| 5,786,259 A * | 7/1998 | Kang | ......................... | 438/396 |
| 5,934,980 A * | 8/1999 | Koos et al. | .................... | 451/41 |
| 5,965,463 A * | 10/1999 | Cui et al. | ................... | 438/723 |
| 5,997,757 A * | 12/1999 | Nagayama et al. | ........... | 216/38 |
| 6,001,538 A * | 12/1999 | Chen et al. | ................. | 430/316 |
| 6,009,830 A * | 1/2000 | Li et al. | ................... | 118/723 R |
| 6,025,223 A * | 2/2000 | Park | ............................ | 438/240 |
| 6,174,737 B1 | 1/2001 | Durlam et al. | .................. | 438/3 |
| 6,225,133 B1 * | 5/2001 | Yamamichi et al. | ........... | 438/3 |
| 6,384,482 B1 | 5/2002 | Yang et al. | ................. | 257/758 |
| 6,391,792 B1 * | 5/2002 | Jang et al. | ................... | 438/734 |
| 6,649,953 B1 | 11/2003 | Cha | ........................... | 257/295 |
| 6,673,675 B1 | 1/2004 | Yates et al. | ................. | 438/257 |
| 6,783,995 B1 * | 8/2004 | Hineman et al. | .............. | 438/3 |
| 6,783,999 B1 * | 8/2004 | Lee | ................................ | 438/3 |
| 6,815,226 B1 * | 11/2004 | Lee et al. | ...................... | 438/3 |
| 6,969,895 B1 * | 11/2005 | Han et al. | ................... | 257/421 |
| 2003/0146459 A1 * | 8/2003 | Katti et al. | ................... | 257/295 |
| 2004/0191930 A1 * | 9/2004 | Son et al. | ....................... | 438/3 |

* cited by examiner

*Primary Examiner*—Jennifer Kennedy
(74) *Attorney, Agent, or Firm*—George D. Saile; Stephen B. Ackerman (57) ABSTRACT

An MRAM structure is disclosed where the distance from a bit line or word line to an underlying free layer in an MTJ is small and well controlled. As a result, the bit line or word line switching current is reduced and tightly distributed for better device performance. A key feature in the method of forming the MRAM cell structure is a two step planarization of an insulation layer deposited on the MTJ array. A CMP step flattens the insulation layer at a distance about 60 to 200 Angstroms above the cap layer in the MTJ. Then an etch back step thins the insulation layer to a level about 50 to 190 Angstroms below the top of the cap layer. Less than 5 Angstroms of the cap layer is removed. The distance variation from the free layer to an overlying bit line or word line is within +/−5 Angstroms.

22 Claims, 4 Drawing Sheets

MRAM CELL STRUCTURE AND METHOD OF FABRICATION

FIELD OF THE INVENTION

The invention relates to an MRAM cell structure, and more particularly, to an MRAM cell structure in which the distance from a bit line or word line to a free layer in a magnetic tunnel junction is well controlled by implementing a planarization process that includes a chemical mechanical polish (CMP) step and an etch back step.

BACKGROUND OF THE INVENTION

A magnetic random access memory (MRAM) device is generally comprised of an array of parallel first conductive lines on a horizontal plane, an array of parallel second conductive lines on a second horizontal plane spaced above and formed in a direction perpendicular to the first conductive lines, and a magnetic tunnel junction (MTJ) formed at each location where a second conductive line crosses over a first conductive line. A first conductive line may be a word line while a second conductive line is a bit line or vice versa. Alternatively, the first conductive line may be a sectioned line which is a bottom electrode. There are typically other devices including transistors and diodes below the array of first conductive lines and at least one additional conductive layer comprised of an array of second word lines or second bit lines above the array of second conductive lines.

The MTJ consists of a stack of layers with a configuration in which two ferromagnetic layers are separated by a thin non-magnetic dielectric layer. One of the ferromagnetic layers is a pinned layer in which the magnetization (magnetic moment) direction is fixed by exchange coupling with an adjacent anti-ferromagnetic (AFM) pinning layer. The second ferromagnetic layer is a free layer in which the magnetization direction can be changed by external magnetic fields. The magnetization direction of the free layer may change in response to external magnetic fields which can be generated by passing currents through the conductive lines. When the magnetization direction of the free layer is parallel to that of the pinned layer, there is a lower resistance for tunneling current across the dielectric layer than when the magnetization directions of the free and pinned layers are anti-parallel. The MTJ stores information as a result of having one of two different magnetic states.

In a read operation, the information is read by sensing the magnetic state (resistance level) of the MTJ through a sensing current flowing through the MTJ, typically in a current perpendicular to plane (CPP) configuration. During a write operation, the information is written to the MTJ by changing the magnetic state to an appropriate one by generating external magnetic fields as a result of applying bit line and word line currents.

Figure 1:
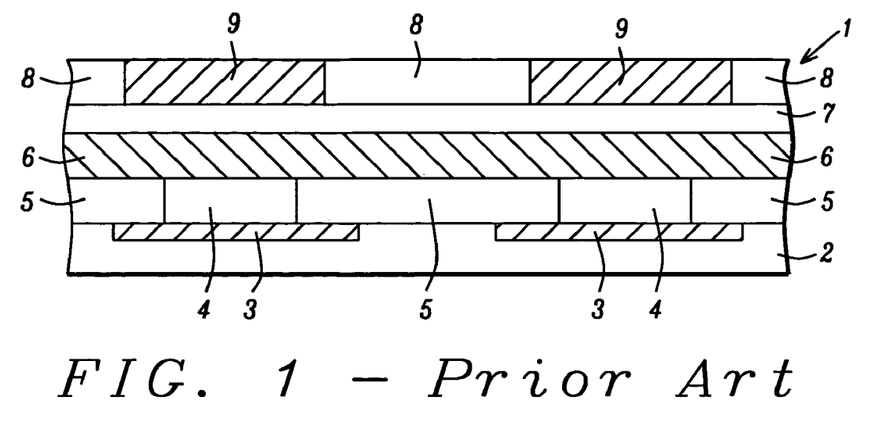
FIG. 1 is a cross-sectional view showing a conventional MRAM structure in which an MTJ is sandwiched between a first conductive layer and a second conductive layer.

Referring to FIG. 1, a conventional MRAM device 1 comprised of two adjacent MRAM cells with two MTJs 4 is depicted. There is a substrate 2 with a first conductive layer that in this example includes bottom electrodes 3 formed therein. Each bottom electrode 3 contacts an overlying MTJ 4 which is enclosed on the sides by an insulation layer 5. In this example, there is a bit line 6 in a second conductive layer that contacts the top of the MTJs 4. Typically, a second insulation layer 7 is deposited on the second conductive layer including bit line 6. A third conductive layer 9 which may be an array of word lines is formed within a third insulation layer 8 on the second insulation layer 7. There are other circuits such as circuits in a peripheral area that are used to select certain MTJs for read or write operations.

Figure 2:
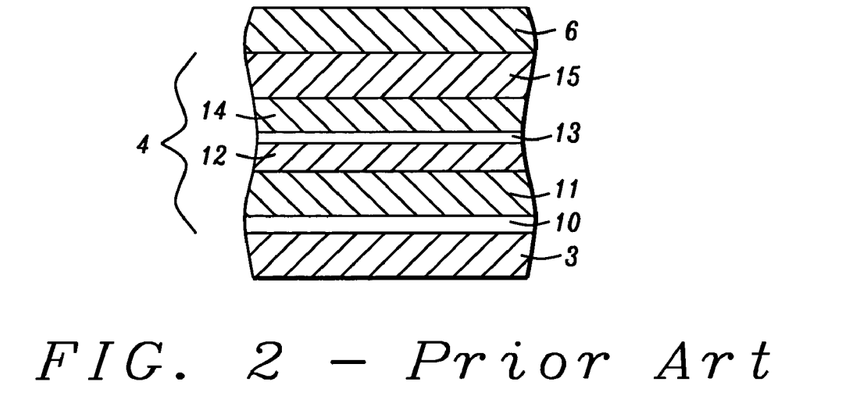
FIG. 2 is an enlarged view of the MTJ in FIG. 1 that depicts the various layers within the MTJ.

Referring to FIG. 2, a typical MTJ 4 is shown which is a stack of layers including one or more bottom seed layers 10 such as NiFeCr formed on a bottom electrode 3. Next, an anti-ferromagnetic (AFM) pinning layer 11 that may be PtMn, for example, is deposited on the seed layer 10. There is a ferromagnetic "pinned" layer 12 on the AFM layer 11 that may be a composite of multiple layers including CoFe layers. The tunnel barrier layer 13 above the pinned layer 12 is generally comprised of a dielectric material such as $Al_2O_3$. Above the tunnel barrier layer 13 is a ferromagnetic "free" layer 14 which may be another composite layer that includes NiFe, for example. At the top of the MTJ stack is one or more cap layers 15. In configurations where only one cap layer is employed, the cap layer 15 is comprised of conductive material such as Ta for making an electrical contact to the subsequently formed bit line 6. When two cap layers are used, the top cap layer is a conductive layer. This MTJ stack has a so-called bottom spin valve configuration. Alternatively, an MTJ stack may have a top spin valve configuration in which a free layer is formed on a seed layer followed by sequentially forming a tunnel barrier layer, a pinned layer, an AFM layer, and a cap layer.

Figure 3:
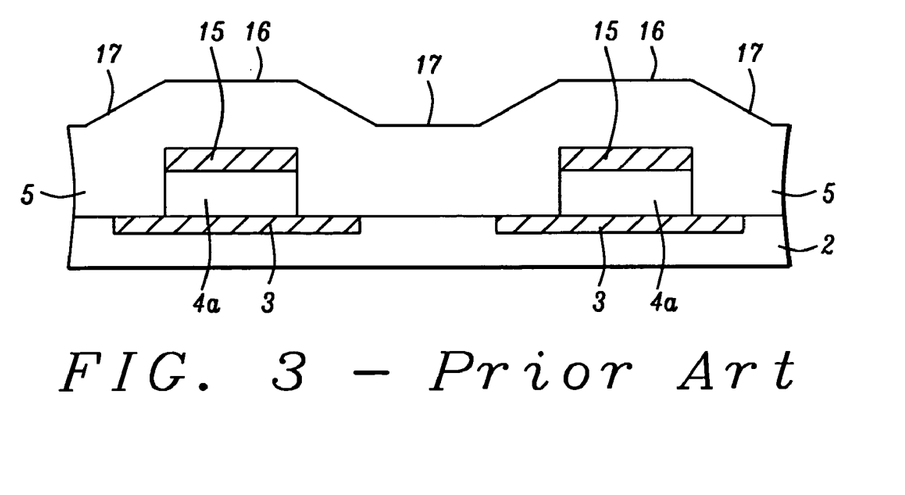
FIG. 3 is a cross-sectional view of an MRAM structure in which an insulation layer has been deposited on an MTJ by a conventional method.

Referring to FIG. 3, the MTJs 4 are comprised of a cap layer 15 and a composite layer 4a that represents the remaining layers in the MTJ stack. A conventional fabrication process involves stripping the mask (not shown) used for patterning the MTJ stack and then depositing an insulation layer 5 such as silicon oxide or $Al_2O_3$ which covers the MTJs. Note that the deposition forms an uneven insulation layer 5 in which the surface region 16 above the cap layer 15 is at a higher level than the surface region 17 not directly above the cap layer. When fabricating high density MRAM chips, it is desirable to have essentially flat topography after each layer is finished. A CMP process is preferred for planarizing the insulation layer 5 so that the top surface of the cap layer 15 is exposed as an electrical contact point for a subsequent second conductive layer.

Figure 4:
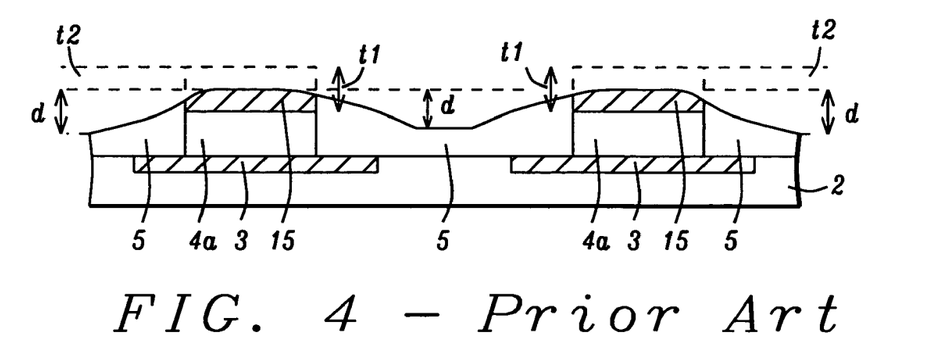
FIG. 4 is a cross-sectional view of the MRAM structure in FIG. 3 after a conventional CMP planarization process which forms protrusions and causes MTJ cap layer erosion.

Referring to FIG. 4, the insulation layer 5, adjacent cap layer 15, and composite layer 4a are shown after the CMP process is complete. Unfortunately, two major issues lead to a degradation of device performance. First, the cap layer 15 has a significant thickness loss during the polishing process. As a result, the cap layer 15 which initially has a thickness $t_1$ is eroded and the thickness loss $t_2$ typically varies across a wafer and from wafer to wafer due to CMP process nonuniformity and other variations. Thus, the distance ($t_1 - t_2$) between a subsequently formed bit line (not shown) and the free layer which is at the top of the composite layer 4a varies significantly and cannot be adequately controlled. Because the magnetic field strength generated by the bit line or word line current at the free layer strongly depends on the distance ($t_1 - t_2$), the inability to control this parameter directly translates to a failure to control the switching magnetic field at the free layer and thereby leads to poor device performance.

A second problem is that the CMP process often forms an MTJ 4 that protrudes above the surrounding insulation layer 5 by a distance d. The protrusion distance d varies across a wafer and from wafer to wafer because of the same non-uniformities mentioned previously. The magnitude of d is often larger than 400 Angstroms and in some cases may be similar or larger than the entire thickness of the MTJ stack. Although the thickness of the capping layer 15 can be increased to compensate for CMP process variations, a better method is needed to controllably form a more planar insulation layer 5 with less cap layer thickness loss.

In U.S. Pat. No. 6,384,482, a method for fabricating a uniform dielectric layer is described that involves depositing a first etch stop layer on a raised metal pattern followed by depositing a dielectric layer and then a second etch stop layer on the dielectric layer. The etch stop layers have a lower polish rate than an oxide dielectric layer in a CMP process and prevent erosion on the top surface of the metal pattern.

A method is disclosed for a CMP process involving an MRAM cell in U.S. Pat. No. 6,673,675 in which a WN or TaN layer is used as a cap layer on an MTJ and also functions as a series resistor or as a CMP stop layer. Other materials such as oxides, nitrides, or amorphous carbon may be used as a CMP stop layer.

In U.S. Pat. No. 6,174,737, MTJs are formed on a planar conductive layer. A dielectric layer is deposited on the MTJs and is etched to define holes to the MTJs. A second conductive layer is deposited in the holes to form conductive lines.

A method for forming an MTJ stack is disclosed in U.S. Pat. No. 6,649,953 in which a second insulation layer is formed on an MTJ without a cap layer. The second insulation layer is planarized to expose the top surface of the free layer before a bit line is formed on the free layer. However, the planarization method is not described.

SUMMARY OF THE INVENTION

One objective of the present invention is to provide an MRAM cell structure in which the distance between a bit line or a word line and an underlying free layer in a magnetic tunnel junction is well controlled.

A further objective of the present invention is to provide an MRAM cell structure in which the capping layer of an MTJ is essentially coplanar with an adjacent insulation layer so that uniform bit lines or word lines can be formed above the capping layer.

A still further objective of the present invention is to provide a method of forming the MRAM cell structure according to the first and second objectives.

These objectives are achieved by providing a substrate comprised of a first insulation layer in which a first conductive layer that includes an array of parallel lines is formed. Alternatively, the first conductive layer may be comprised of sectioned lines which are bottom electrodes. A stack of layers is formed by successively depositing a seed layer, an AFM layer, a pinned layer, a barrier layer, a free layer, and a cap layer on the substrate. An array of MTJs is fabricated on the first conductive layer by conventional means in which a plurality of MRAM cells is formed on each conductive line at locations where parallel lines in a subsequently formed second conductive layer will cross overhead. For example, a mask pattern is formed on the stack of layers and then ion beam etching or reactive ion etching is performed to transfer the pattern through the stack of layers using the mask as a template. The mask is removed to leave an array of MTJs on the first conductive layer. A second insulation layer such as silicon oxide or $Al_2O_3$ is deposited on the substrate and over the MTJs to a level that completely fills the gap between adjacent MTJs.

A key feature is that the second insulation layer is planarized by a two step process. In a first step, a CMP method is employed to reduce the thickness of the second insulation layer and form a planar top surface. The CMP step is terminated when the thickness of the second insulation layer above the top surface of the MTJs is about 60 to 200 Angstroms as determined by an in-situ thickness measurement or by a separate film thickness measurement. Once the film thickness of the second insulation layer on the MTJs is measured across the wafer, a second step is performed which involves a blanket plasma etch to uniformly etch back the second insulation layer. The etch back removes the remaining second insulation layer on the MTJs and has a predetermined over etch time to compensate for slight nonuniformities in MTJ stack thickness and in insulation layer thickness across the wafer. Because of the highly selective etch back step, cap layer thickness loss is less than 5 Angstroms and a cap layer thickness variation of less than +/−5 Angstroms is achieved. The uniform top surface of the second insulation layer is now about 50 to 190 Angstroms below the top surface of the cap layer. Following the etch back step, a second conductive layer comprised of bit lines (or word lines) is formed on the MTJs. A third conductive layer comprised of word lines (or bit lines) may be formed thereafter and is separated from the second conductive layer by an insulation layer.

The present invention is also an MRAM cell structure formed by the novel two step planarization method. An array of MTJs is formed on parallel lines or on bottom electrodes in a first conductive layer on a substrate. Each MTJ may be comprised of a stack of layers in which a seed layer, an AFM layer, a pinned layer, a barrier layer, a free layer, and a cap layer are formed in succession. The MTJs are enclosed on the sides by a second insulation layer that is essentially coplanar with the top surface of the cap layer. An array of parallel lines in a second conductive layer is formed on the second insulation layer and contacts the top surface of the cap layer in each MTJ. A key feature is that the distance between a line in the second conductive layer and an underlying free layer is controlled to within a tight specification and is smaller than the distance between a free layer and an overlying bit line or word line in a conventional MRAM structure.

DETAILED DESCRIPTION OF THE INVENTION

The present invention is an MRAM cell structure on an MRAM chip in which the distance from a bit line or word line to an underlying free layer in a magnetic tunnel junction (MTJ) is well controlled and an adjacent insulation layer is essentially flat and coplanar with the MTJ. The drawings are provided by way of example and are not intended to limit the scope of the invention. Although only two MRAM cells and two MTJs are depicted in the cross-sectional drawings, it is understood that from a top-down view there are a plurality of MRAM cells in an array that includes multiple rows and multiple columns on the MRAM chip. MRAM cell structure is intended to mean a portion of the MRAM chip including the MTJ as well as nearby insulation layers and conductive layers.

Figure 5:
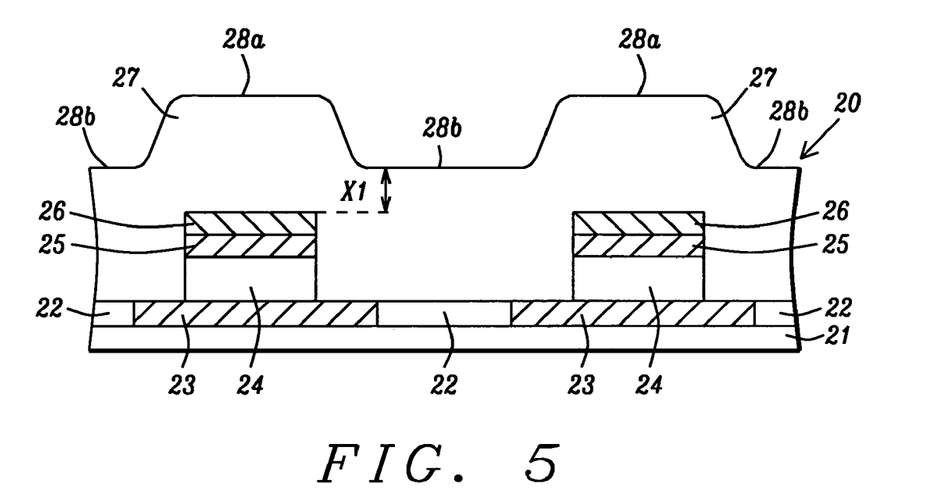
FIG. 5 is a cross-sectional view that shows MTJs covered by a second insulation layer in an MRAM array according to the present invention.

A method of forming the MRAM cell structure of the present invention will be described first. Referring to FIG. 5, a partially completed MRAM cell structure 20 is shown that includes a substrate 21 which may be silicon or another semiconductor substrate used in the art. The substrate 21 typically contains other devices such as transistors and diodes. A first insulation layer 22 is deposited on the substrate 21 by a chemical vapor deposition (CVD), plasma enhanced CVD, or spin on method and may be silicon oxide or a low k dielectric material, for example. A first conductive layer 23 comprised of parallel lines or sectioned lines which are bottom electrodes is formed within the first insulation layer 22 by a conventional process that typically involves a final planarization step so that the first conductive layer 23 is coplanar with the first insulation layer 22. Those skilled in the art will appreciate that there may be a thin diffusion barrier layer (not shown) between the first conductive layer 23 and insulation layer which is especially useful when the first conductive layer is comprised of copper. In the exemplary embodiment, the first conductive layer is copper and has first conductive lines which are parallel bit lines or word lines.

Next an array of MTJs is fabricated at locations on the first conductive layer 23 so that each MTJ will provide an electrical contact between a first conductive line and a subsequently formed bit line or word line in a second conductive layer above the MTJ. The MTJs are comprised of a bottom layer 24, a free layer 25, and a cap layer 26 formed by a method known to those skilled in the art. In one embodiment, an MTJ stack of layers is deposited on the first insulation layer 22 and first conductive layer 23 by a method such as sputter deposition. The bottom layer 24 in the MTJ stack is a composite layer comprising a seed layer such as NiFeCr, an AFM pinning layer such as PtMn on the seed layer, a pinned layer that may be CoFe on the AFM layer, and a tunnel barrier layer such as $Al_2O_3$ on the pinned layer. Moreover, each of the aforementioned layers in the bottom layer 24 may be a composite layer. For example, a non-magnetic layer to increase specular refraction or a coupling layer may be inserted into the pinned layer as appreciated by those skilled in the art. Optionally, the pinned layer may be a synthetic anti-parallel pinned (SyAP) layer in which two ferromagnetic layers such as CoFe are separated by a Ru coupling layer. A free layer 25 that may be comprised of NiFe or a composite layer is formed on the bottom layer 24. Finally, a cap layer 26 with a thickness of about 50 to 400 Angstroms and which is typically a conductive material such as Cu, Ru, or a composite layer with an upper Ru layer is formed on the free layer 25.

In one embodiment, the MTJ stack of layers is transformed into an array of MTJs by a well known sequence that includes patterning a mask layer (not shown) on the cap layer 26, etching through the MTJ stack of layers in regions exposed by openings in the mask layer, and stripping the mask layer.

A second insulation layer 27 is deposited on the MTJs, first conductive layer 23, and first insulation layer 22 to a level that is higher than the cap layer 26. The second insulation layer 27 is typically comprised of silicon oxide or a low k dielectric material. Note that the second insulation layer 27 has an uneven surface with regions 28a that are formed above the cap layer 26 which are at a higher level above the substrate 21 than regions 28b formed above the first insulation layer 22. The thickness difference $x_1$ between regions 28b and the cap layer 26 is about 800 to 2000 Angstroms.

Figure 6:
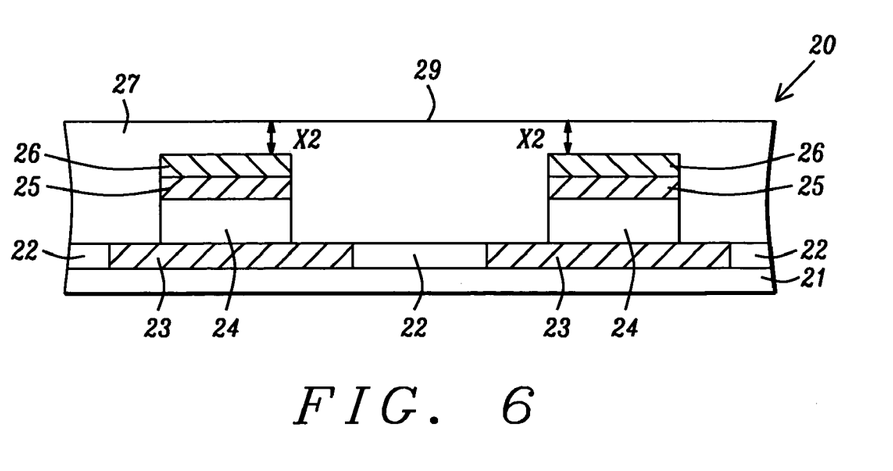
FIG. 6 is a cross-sectional view that illustrates a planar second insulation layer above the MTJs in FIG. 5 after a CMP method according to the present invention.

Referring to FIG. 6, a key feature of the present invention is a planarization process comprised of two steps of which the first is a CMP step. Planarization of the second insulation layer 27 to become about coplanar with the cap layer 26 is a critical step in the MRAM cell structure fabrication. As described previously, conventional CMP methods remove an excess of the insulation layer adjacent to an MTJ and leave protruding MTJs that have an eroded cap layer. It is critical that the thickness loss in the cap layer 26 as a result of a CMP process is minimized to control the distance between the free layer 25 and a subsequently formed bit line or word line on the cap layer. Furthermore, the second insulation layer 27 after planarization should have a uniform thickness and be essentially coplanar with the cap layer to enable a good process window for forming a word line or bit line pattern on the MTJs.

In the exemplary embodiment, a CMP step is employed to reduce the thickness of the second insulation layer 27 so that its top surface 29 is planar across the wafer. Before planarization, there is some nonuniformity in the maximum thickness of the second insulation layer 27 in regions 28a and in the thickness of each layer within an MTJ at different locations on substrate 21. This lack of uniformity is often referred to as within wafer thickness variation which results from nonuniformity in deposition methods. In addition, there are wafer to wafer film thickness variations for each layer within an MRAM cell. For instance, an oxide deposition on a first wafer in one process chamber may result in a slightly different second insulation layer thickness than an oxide deposition on a second wafer in a second process chamber. The CMP step is programmed to stop when the thickness $x_2$ of the insulation layer 27 above the cap layer 26 reaches a preset target in a range of about 60 to 200 Angstroms. The inventors have found that the total variation in thickness $x_2$ uniformity is about 140 Angstroms which includes deposition nonuniformities and CMP process non-uniformity.

Film thickness is determined by an in-situ measurement in the CMP tool or by a separate film thickness measurement tool and is performed at a plurality of locations across each substrate 21 to establish that the thickness $x_2$ is within the specified range of about 60 to 200 Angstroms. State of the art film thickness measurement tools are capable of accurately measuring $x_2$ to within a few Angstroms.

In one example where the original thickness $x_1$ of the second insulation layer 27 above the cap layer 26 in regions 28b is 1000 Angstroms, a flat surface 29 is achieved after 800 Angstroms of the second insulation layer is removed from regions 28b. It is understood that a greater thickness of the second insulation layer 27 is removed from regions 28a during the same polishing process to generate a planar surface 29. Even though a flat surface 29 may be achieved when $x_2$ is greater than 200 Angstroms, the CMP step is continued until the preset target range is reached.

Figure 7:
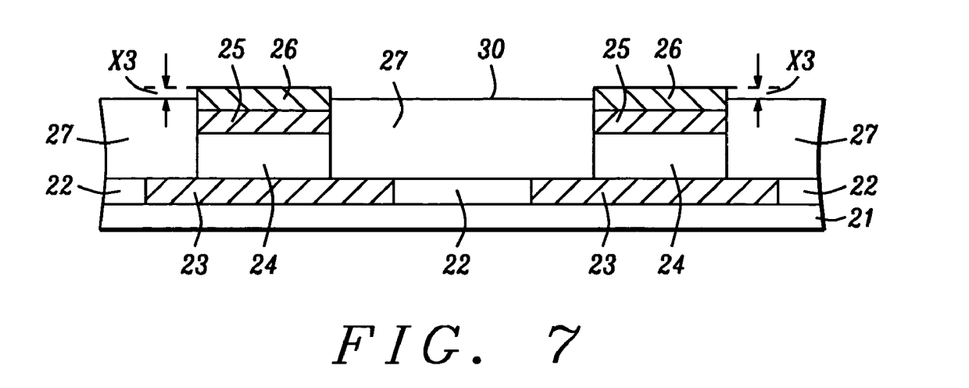
FIG. 7 is a cross-sectional view that depicts a planar second insulation layer after the structure in FIG. 6 is subjected to an etch back step according to the present invention.

After the CMP step is completed and film thickness measurements are taken for thickness $x_2$, a second planarization step which is an etch process is performed. The etch is considered to be a planarization step since it is intended to make the second insulation layer 27 essentially coplanar with the cap layer 26. Referring to FIG. 7, the etch is a blanket etch process and may be performed with isotropic or anisotropic conditions. In the embodiment where the etch is a plasma etch, a low RF power or low bias power may be employed. Preferably, the resulting etch uniformity is less than about +/−5% (3 sigma) across the wafer. Because of the range in thickness $x_2$ of 60 to 200 Angstroms, some overetch is necessary to ensure that MTJs which have an overlying second insulation layer thickness of about 200 Angstroms are uncovered.

When the second insulation layer 27 is comprised of an oxide, the etch step is preferably based on a fluorocarbon $C_xF_yH_z$ chemistry and may include an inert gas. The etch step has a high selectivity between the second insulation layer 27 and the cap layer 26. Typically, only a few Angstroms of the cap layer are removed during the etch. In other words, for a cap layer thickness of a few hundred Angstroms, the cap layer thickness variation after the etch back step is within +/−5 Angstroms. This is a significant improvement over a CMP process where selectivity between a cap layer and an adjacent insulation layer is typically much less than in a plasma etch and where a cap layer thickness variation as high as +/−40 Angstroms is observed.

Continuing the example where the second insulation layer 27 is an oxide with an $x_2$ thickness in the range of 60 to 200 Angstroms remaining after the CMP step, a plasma etch based on a fluorocarbon chemistry is used to etch about another 250 Angstroms from the second insulation layer. As a result, the top surface 30 of the second insulation layer 27 is now slightly below the top surface of the cap layer 26. The distance $x_3$ between the top of the cap layer 26 and the top surface 30 of the second insulation layer 27 is about 50 to 190 Angstroms. Furthermore, less than 4 Angstroms of the cap layer are removed during the etch compared to a 40 Angstrom loss during a prior art CMP method. The protrusion amount $x_3$ of the cap layer 26 above the thinned second insulation layer 27 is less than half of the protrusion that is typically observed with prior art methods such as the amount d in FIG. 4 which is often greater than 400 Angstroms after a conventional CMP process. Therefore, the cap layer 26 can be significantly thinner in the present invention than in a conventional MRAM cell where the MTJ is subjected to a standard CMP process. As a result, the distance from an overlying bit or word line to the free layer 25 can be much smaller thereby leading to an MRAM chip with higher performance.

The etch back planarization step results in a top surface 30 of the second insulation layer 27 that is more uniform than in prior art methods where dishing or indentations in the second insulation layer are easily produced by a CMP process. Because of a small $x_3$ value and a smoother top surface 30 on the second insulation layer 27, the present invention enables a larger process window for the following step which is to form a second conductive layer comprised of an array of parallel bit lines or word lines above the second insulation layer 27 and cap layer 26. A sputter etch process may be employed to remove the etch residues from the etch back step, if necessary.

Figure 8:
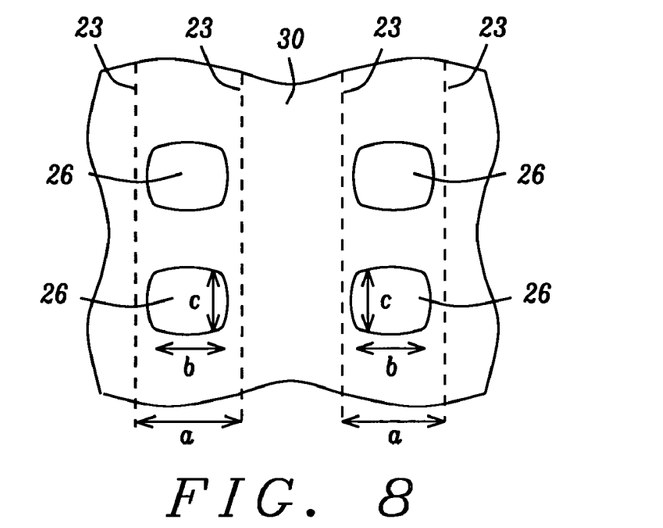
FIG. 8 is a top-down view of the partially completed MRAM structure in FIG. 7.

Referring to FIG. 8, a top-down view of the MRAM structure 20 in FIG. 7 is depicted. Note that a large enough section of an MRAM chip is provided to show two MRAM cells on each of the two first conductive lines 23 which are outlined by the dashed lines. Only the top surfaces of the cap layers 26 which have an elliptical shape in this example are visible above the top surface 30 of the second insulation layer 27. The width b of a cap layer 26 (and MTJ) is equal to or less than the width a of a first conductive line 23. The width b may be less than the width a in order to allow for some misalignment in the MTJ patterning process. In a preferred embodiment, the width b is about 0.2 to 0.9 microns.

Figure 9:
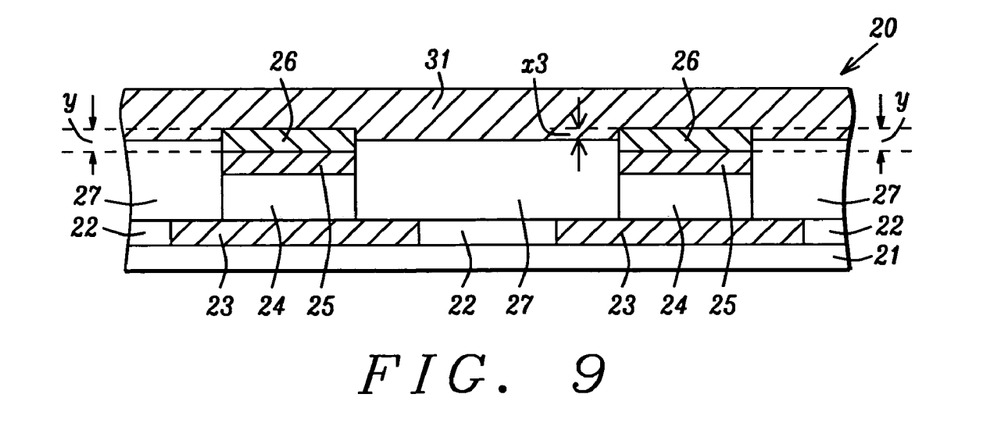
FIG. 9 is a cross-sectional view of the MRAM structure in FIG. 7 after a second conductive layer is formed on the MTJs according to the present invention.

Referring to FIG. 9, a second conductive layer is formed on the second insulation layer 27 and on cap layer 26 by a conventional method and is comprised of a plurality of second conductive lines of which the second conductive line 31 is depicted. From a top-down view in FIG. 10, the second conductive layer is typically comprised of an array of parallel second conductive lines 31 formed within a dielectric layer 40 as appreciated by those skilled in the art. The dielectric layer 40 is formed on the second insulation layer 27. The second conductive lines 31 may be comprised of copper or another metal and are preferably coplanar with the dielectric layer 40 as a result of a planarization procedure. Note that the second conductive lines 31 are aligned perpendicular to the direction of the first conductive lines 23. The width w of a second conductive line 31 may be equal to or greater than the length c of an underlying cap layer (and MTJ). In one embodiment, the second conductive lines 31 are bit lines and the first conductive lines 23 are word lines. Alternatively, the second conductive lines 31 are word lines and the first conductive lines 23 are bit lines. It is understood that the conductive layers in the MRAM cell structure may be formed by a well known damascene process or by a non-damascene method wherein a sheet metal film is deposited on a substrate and is then patterned to form conductive lines.

Returning to FIG. 9, one advantage of the present invention is that the thickness y of the cap layer 26 is significantly less than in a prior art MTJ. Moreover, the thickness y is more tightly controlled because of the previous planarization process involving a first CMP step and a second highly selective etch back step. The variation in distance y between the free layer 25 and the second conductive line 31 can be controlled to within +/−5 Angstroms in each of the plurality of MTJs formed on the substrate 21. When an etch process with high uniformity is employed, the variation in thickness y may be reduced to less than 5 Angstroms in each of the MRAM cells on substrate 21. A small thickness y with tight control results in better device performance since the bit line or word line switching current is smaller and tightly distributed.

Figure 11:
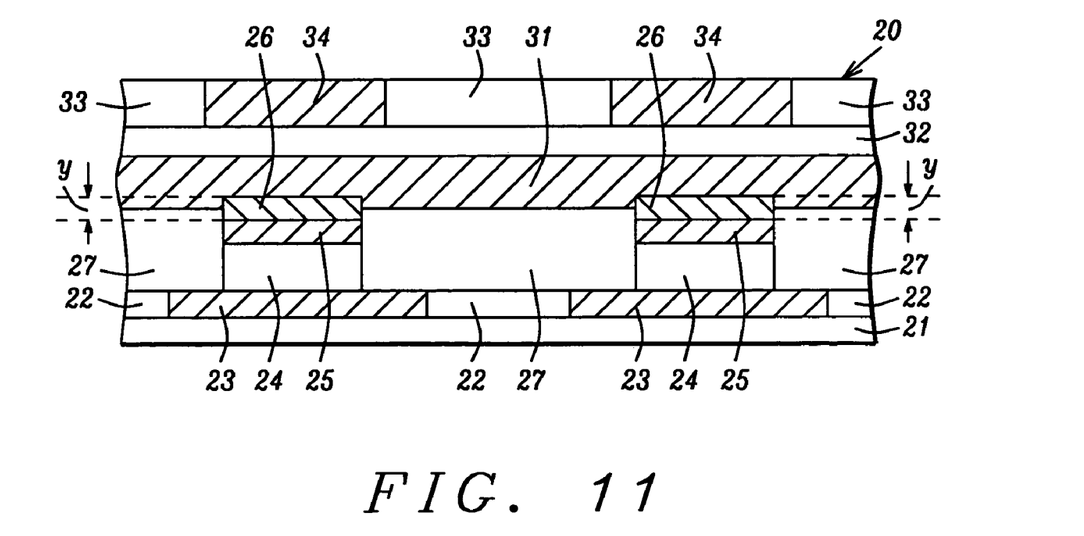
FIG. 11 is a cross-sectional view of the MRAM structure in FIG. 10 after third and fourth insulation layers are formed on the second conductive layer and a third conductive layer is formed within the fourth insulation layer.

Referring to FIG. 11, the MRAM cell structure 20 may be completed by well known patterning, etching, deposition, and planarization techniques. A third insulation layer 32 is formed on the dielectric layer 40 and on the second conductive lines 31 and a fourth insulation layer 33 is deposited on the third insulation layer. Then a third conductive layer comprised of third conductive lines 34 is formed in the fourth insulation layer. The third conductive lines 34 are aligned perpendicular to the second conductive lines 31. When the second conductive lines 31 are bit lines, then the third conductive lines 34 are word lines. Optionally, if the second conductive lines 31 are word lines, the third conductive lines 34 are bit lines. Furthermore, the distances from the second conductive lines 31 to the free layer 25 and from the third conductive lines 34 to the free layer are smaller and more tightly controlled than in a conventional MRAM fabrication process. Thus, there is a higher chip performance in the MRAM structure of the present invention due to smaller and more tightly distributed bit line/word line writing currents.

The two step planarization method of the present invention is conducted with existing equipment and is expected to provide a cost savings over a standard CMP planarization because less rework is necessary to repair insulation layers or cap layers that have been excessively thinned. Additionally, a higher performing MRAM chip formed by the present invention commands a higher value in the marketplace.

The present invention is also an MRAM cell structure on an MRAM chip as depicted in FIG. 9 and FIG. 11 which is formed by a process sequence that includes the previously described two step planarization method. The MRAM cell structure is defined as an MTJ and nearby conductive and insulation layers. Although two MRAM cells are illustrated in the exemplary embodiment, it is understood that from a top-down view as in FIG. 10, the MRAM chip has a plurality of MRAM cells that are arranged above a substrate in multiple rows and multiple columns. A first insulation layer 22 is formed on a substrate 21 that typically contains devices such as transistors and diodes. The first insulation layer may be comprised of silicon oxide or a low k dielectric material. A first conductive layer comprised of first conductive lines 23 is formed within the first insulation layer 22 and is coplanar with the first insulation layer. In one embodiment, the first conductive lines 23 are bit lines. Alternatively, the first conductive lines 23 are word lines. The first conductive layer may be comprised of copper.

Figure 10:
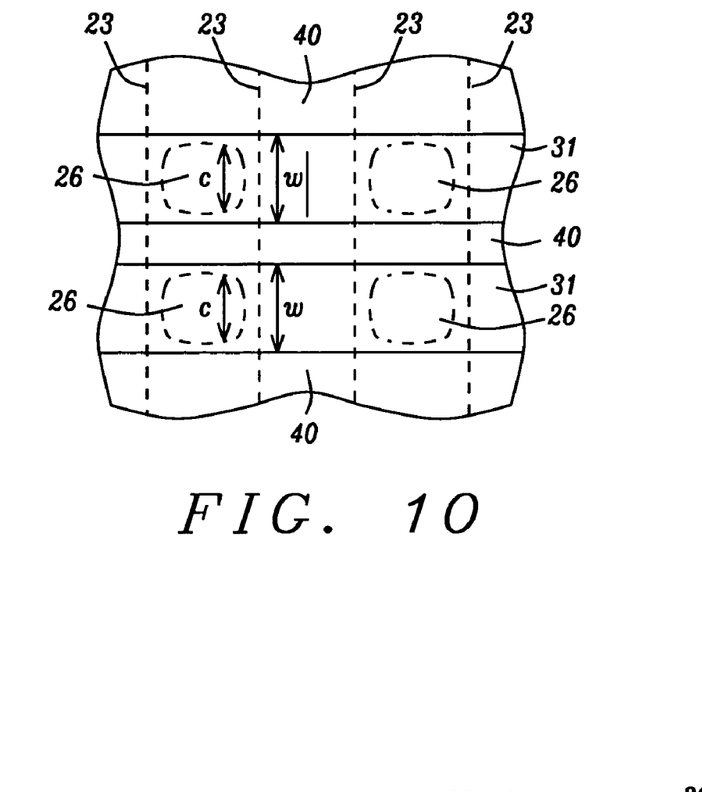
FIG. 10 is a top-down view of the MRAM cell structure in FIG. 9

An array of MTJs comprised of a bottom layer 24, a free layer 25, and a cap layer 26 is formed on the first conductive lines 23. The MTJs are surrounded on the sides by a second insulation layer 27 that is essentially coplanar with the cap layer 26. The second insulation layer 27 may be silicon oxide or a low k dielectric layer and is formed on the first insulation layer 22 and on the first conductive lines 23. A second conductive layer comprised of second conductive lines 31 is formed above the second insulation layer 27 and on the cap layer 26. As shown in FIG. 10, the second conductive lines 31 are contained within a dielectric layer 40 that is formed on the second insulation layer 27 and MTJs and are aligned perpendicular to the first conductive lines 23. An MTJ is formed at each location where a second conductive line 31 crosses over a first conductive line 23. In the embodiment where the first conductive lines 23 are bit lines, the second conductive lines 31 are word lines. Optionally, when the first conductive lines 23 are word lines, the second conductive lines 31 are bit lines. Alternatively, the first conductive layer is comprised of sectioned lines 23 which are bottom electrodes and the second conductive lines are either bit lines or word lines. The first conductive lines 23 have a first width a that is equal to or larger than the width b of a cap layer 26 and MTJ (FIG. 8). The second conductive lines 31 have a width w that is equal to or larger than the length c of a cap layer 26 and MTJ (FIG. 10).

The bottom layer 24 is a composite layer comprised of a seed layer such as NiFeCr formed on a first conductive line 23, an AFM pinning layer such as PtMn on the seed layer, a pinned layer that may be CoFe on the AFM layer, and a tunnel barrier layer such as $Al_2O_3$ on the pinned layer. Moreover, each of the aforementioned layers in the bottom layer 24 may be a composite layer. For example, a non-magnetic layer to increase specular refraction or a coupling layer may be inserted into the pinned layer as appreciated by those skilled in the art. A free layer 25 that may be comprised of NiFe or a composite layer is formed on the bottom layer 24. Finally, a cap layer 26 having a thickness y of about 50 to 400 Angstroms and comprised of a metal such Cu, Ru or a composite metal layer with an upper Ru layer is formed on the free layer 25.

An important feature of the present invention is that the distance y (FIG. 11) between a second conductive line 31 and a free layer 25 and the distance between third conductive lines 34 and the free layer are smaller and more tightly controlled across the substrate relative to the corresponding distances in a conventional MRAM cell. In fact, a typical cap layer thickness y of a few hundred Angstroms has a variation within +/−5 Angstroms. In other words, the distance y can be controlled to within 10 Angstroms for all the MRAM cells on substrate 21. This is a significant improvement over prior art MRAM cell structures in which a cap layer thickness y may be twice as large and has a variation as high as +/−40 Angstroms. The smaller cap layer thickness with tighter control leads to better device performance since the resulting switching current is smaller and more highly distributed.

A second feature of the present invention that provides an advantage is that the second insulation layer 27 is essentially coplanar with the cap layer 26. For example, the thickness difference $x_3$ between the second insulation layer and the cap layer 26 is only about 50 to 190 Angstroms which is less than half of the thickness difference of 400 Angstroms or more which is commonly observed for $x_3$ in conventional MRAM cell structures. As a result of the small $x_3$ value, it is easier to fabricate layers above the MTJ and second insulation layer 27. In other words, overlying layers are formed with a more uniform thickness and with a larger process window.

Yet another advantage of the present invention is that the top surface of the second insulation layer 27 is essentially flat in comparison to a conventional MRAM chip where the insulation layer between MRAM cells is typically uneven and may have dishing or indentation on the top surface as the result of a previous CMP planarization step. A more uniform second insulation layer also enables improved uniformity in the thickness of the second conductive lines 31 in the second conductive layer.

While this invention has been particularly shown and described with reference to, the preferred embodiment thereof, it will be understood by those skilled in the art that various changes in form and details may be made without departing from the spirit and scope of this invention.

We claim:

1. A method of fabricating an MRAM cell structure having a plurality of MTJ elements each with an uppermost cap layer that has a certain thickness whereby the certain thickness is controlled within a range of about +/−5 Angstroms, comprising:

(a) providing a plurality of MTJ elements on a substrate and depositing an insulation layer on the substrate to a level that covers the MTJ elements including a top surface of said cap layer;

(b) performing a CMP step to planarize said insulation layer wherein the planarized insulation layer has a first thickness above the top surface of said cap layer; and (c) performing an etch back step to reduce the thickness of said insulation layer wherein the insulation layer is planarized at a second thickness below the top surface of said cap layer.

2. The method of claim 1 wherein the insulation layer is comprised of silicon oxide or a low k dielectric material and has a thickness of about 800 to 2000 Angstroms above said cap layer before said CMP step.

3. The method of claim 1 wherein said certain thickness above the cap layer is about 60 to 200 Angstroms.

4. The method of claim 1 wherein said second thickness below the top surface of said cap layer is about 50 to 190 Angstroms.

5. The method of claim 1 wherein the cap layer is comprised of Cu, Ru, or a composite layer with an upper Ru layer.

6. The method of claim 5 wherein the cap layer has a certain thickness that is reduced by less than 5 Angstroms during said etch back step.

7. The method of claim 1 wherein etch back step is a plasma etch based on a fluorocarbon chemistry that has a high selectivity between the insulation layer and said cap layer.

8. The method of claim 1 wherein said first thickness is about 250 Angstroms greater than said second thickness.

9. The method of claim 1 wherein the certain thickness of said cap layer is between about 50 and 400 Angstroms.

10. A method for fabricating an MRAM cell structure having a plurality of MTJ elements each with an uppermost cap layer that has a certain thickness whereby the certain thickness is controlled within a range of about +/−5 Angstroms, comprising:
  (a) forming a first conductive layer comprised of a first line on a substrate;
  (b) forming a plurality of MTJ elements on said first line, each MTJ having a bottom layer, a free layer on said bottom layer, and a cap layer on said free layer;
  (c) depositing an insulation layer on said substrate to a level that covers the MTJ elements including a top surface of said cap layer;
  (d) performing a CMP step to planarize said insulation layer wherein the planarized insulation layer a first thickness above the top surface of said cap layer;
  (e) performing an etch back step to reduce the thickness of said insulation layer wherein the insulation layer is planarized at a second thickness below the top surface of said cap layer; and
  (f) forming a second conductive layer on said insulation layer and cap layer, said second conductive layer is comprised of a second line that contacts the top surface of said cap layer.

11. The method of claim 10 wherein the bottom layer of said MTJ elements is a composite layer comprised of a seed layer on said first line, an AFM layer on the seed layer, a pinned layer on the AFM layer, and a tunnel barrier layer on the pinned layer.

12. The method of claim 10 wherein the first line is comprised of copper and is a bottom electrode, a bit line, or a word line.

13. The method of claim 10 wherein the second line is comprised of copper and is a word line or bit line.

14. The method of claim 10 wherein said first thickness above the cap layer is about 60 to 200 Angstroms.

15. The method of claim 10 wherein said second thickness below the cap layer is about 50 to 190 Angstroms.

16. The method of claim 10 wherein the cap layer has a thickness between about 50 and 400 Angstroms and is comprised of Cu, Ru, or a composite layer with an upper Ru layer.

17. The method of claim 16 wherein said cap layer has a thickness that is reduced by less than 5 Angstroms during said etch back step.

18. The method of claim 10 wherein the MTJ elements have a width from about 0.2 to 0.9 microns.

19. The method of claim 10 wherein the insulation layer is comprised of silicon oxide or a low k dielectric material and has a thickness of about 800 to 2000 Angstroms above said cap layer before said CMP step.

20. The method of claim 10 wherein etch back step is a plasma etch based on a fluorocarbon chemistry that has a high selectivity between the insulation layer and said cap layer.

21. The method of claim 10 wherein said MRAM chip is further comprised of a plurality of MRAM cells that have a distance variation of less than +/−5 Angstroms from a free layer to an overlying second line after the etch back step.

22. The method of claim 10 wherein the MRAM chip is further comprised of an array of lines in said first conductive layer that are parallel to said first line, an array of lines in the second conductive layer that are parallel to the second line, and an array of MTJs formed at each location where a second line crosses over a first line wherein the distance between a free layer and an overlying second line is maintained to within 10 Angstroms.

* * * * *